(12) United States Patent
Barkshire et al.

(10) Patent No.: US 8,421,027 B2
(45) Date of Patent: Apr. 16, 2013

(54) CHARGED PARTICLE ANALYSER AND METHOD USING ELECTROSTATIC FILTER GRIDS TO FILTER CHARGED PARTICLES

(75) Inventors: Ian Richard Barkshire, Cambridgeshire (GB); Peter John Statham, Buckinghamshire (GB); Marcus Jacka, York (GB)

(73) Assignee: Oxford Instruments Nanotechnology Tools Limited, Oxon (GB)

( * ) Notice: Subject to any disclaimer, the term of this patent is extended or adjusted under 35 U.S.C. 154(b) by 367 days.

(21) Appl. No.: 12/523,287

(22) PCT Filed: Jan. 14, 2008

(86) PCT No.: PCT/GB2008/000109
§ 371 (c)(1),
(2), (4) Date: Feb. 22, 2010

(87) PCT Pub. No.: WO2008/087384
PCT Pub. Date: Jul. 24, 2008

(65) Prior Publication Data
US 2010/0163725 A1    Jul. 1, 2010

(30) Foreign Application Priority Data
Jan. 15, 2007    (GB) .................................. 0700754.5

(51) Int. Cl.
*H01J 3/26*    (2006.01)
(52) U.S. Cl.
USPC .................................................... 250/396 R
(58) Field of Classification Search .............. 250/396 R, 250/311, 306, 305
See application file for complete search history.

(56) References Cited

U.S. PATENT DOCUMENTS

| | | | |
|---|---|---|---|
| 3,717,785 A * | 2/1973 | Guernet | 250/396 R |
| 3,937,958 A * | 2/1976 | Rusch et al. | 250/307 |
| 4,246,479 A * | 1/1981 | Gopinathan | 250/305 |
| 4,851,670 A * | 7/1989 | Krivanek | 250/305 |
| 5,187,371 A * | 2/1993 | Matsui et al. | 250/396 R |
| 5,583,336 A | 12/1996 | Kelly | |
| 6,492,644 B1 | 12/2002 | Staib | |
| 2002/0024013 A1* | 2/2002 | Gerlach et al. | 250/311 |

(Continued)

FOREIGN PATENT DOCUMENTS

| | | |
|---|---|---|
| DE | 2216821 | 9/1973 |
| EP | 1657736 | 5/2006 |
| WO | WO-2008087384 | 7/2008 |

OTHER PUBLICATIONS

Erich Plies—Secondary electron energy analyzers for electron-beam testing—Nuclear Instruments and Methods in Physics Research A 298 (1990), pp. 142-155.

*Primary Examiner* — Robert Kim
*Assistant Examiner* — Jason McCormack
(74) *Attorney, Agent, or Firm* — Blank Rome LLP

(57) ABSTRACT

A charged particle analyzer (1) comprises a first non-imaging electrostatic lens (8, 9) for receiving charged particles having divergent, trajectories and for converting the said trajectories into substantially parallel trajectories. At least one planar filter (10) is provided for receiving the charged particles having the substantially parallel trajectories and for filtering the charged particles in accordance with their respective energies. A second non-imaging electrostatic lens (11) receives the energy filtered charged particles and selectively modifies their trajectories as a function of their energies. A charged particle detector (12) then receives the charged particles in accordance with their selectively modified trajectories.

37 Claims, 9 Drawing Sheets

U.S. PATENT DOCUMENTS

Figure 1:
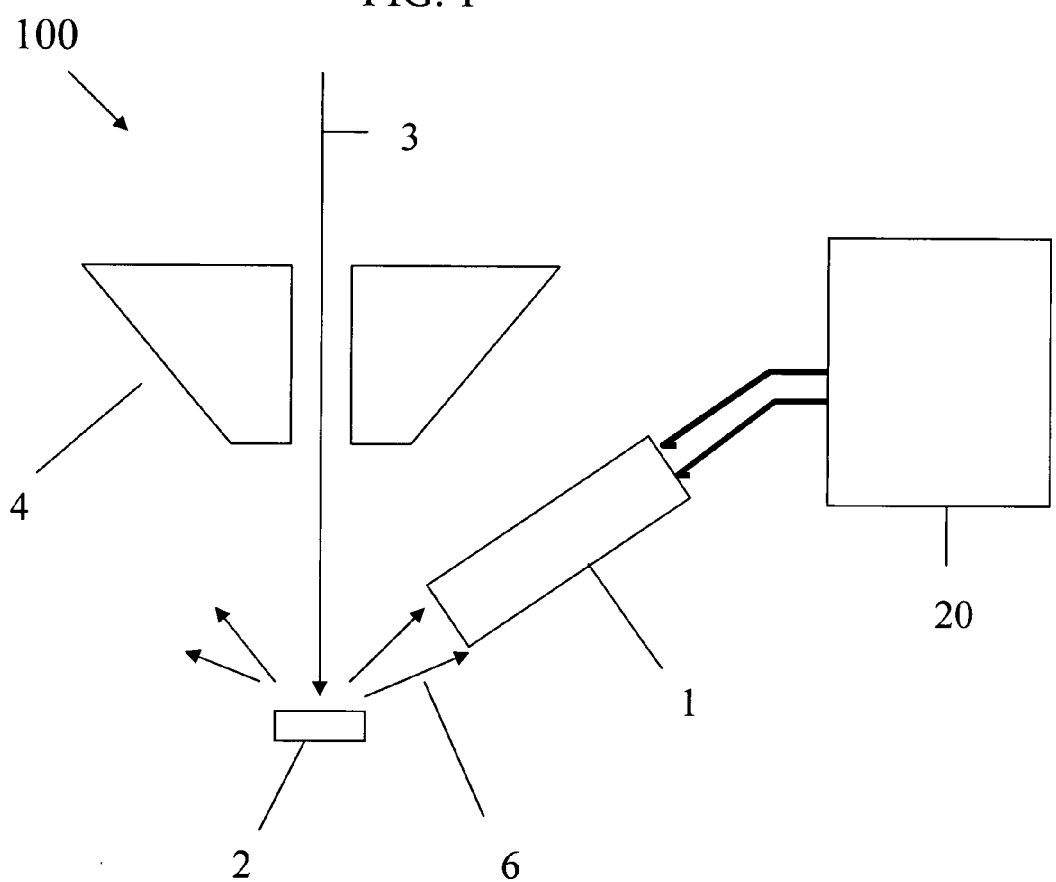

| | | |
|---|---|---|
| 2003/0127604 A1 | 7/2003 | Todokoro et al. |
| 2004/0021069 A1* | 2/2004 | Barnard ........................ 250/288 |
| 2004/0188608 A1* | 9/2004 | Kaneyama .................... 250/305 |
| 2006/0226360 A1* | 10/2006 | Frosien ........................ 250/310 |
| 2007/0010973 A1* | 1/2007 | deCecco et al. .............. 702/189 |
| 2007/0205375 A1* | 9/2007 | Ward et al. .................... 250/398 |
| 2008/0135748 A1* | 6/2008 | Daimon et al. ................ 250/305 |
| 2009/0200463 A1* | 8/2009 | Degenhardt et al. .......... 250/307 |

* cited by examiner

CHARGED PARTICLE ANALYSER AND METHOD USING ELECTROSTATIC FILTER GRIDS TO FILTER CHARGED PARTICLES

CROSS-REFERENCE TO RELATED APPLICATIONS

This application is the U.S. national phase of P.C.T. International Patent Application No. PCT/GB2008/000109, filed Jan. 15, 2007, titled "CHARGED PARTICLE ANAYLSER AND METHOD," published in English on Jul. 24, 2008, as WO 2008 087384 A2, which claims the benefit of U.K. Patent Application No. 0700754.5, filed Jan. 15, 2007. The entire contents of each application are incorporated herein by reference.

FIELD OF THE INVENTION

The present invention relates to a charged particle analyser, a microscope including such an analyser and a method of using the analyser. The charged particle analyser finds use in many different analytical applications although in an electron analyser form it finds particular advantage when used with scanning electron microscopes (SEM). The analyser provides an improved signal detection and also high resolution image contrast based upon sampled composition. It also provides for new methods for material analysis based on the energy distribution of charged particles emitted from the specimen.

BACKGROUND TO THE INVENTION

A number of known analysers are now described, particularly in relation to the field of scanning electron microscopy.

Scanning electron microscopes (SEMs) are common tools for the observation of small features. A finely focused electron beam ("probe") with an energy typically between about 1 keV and 20 keV is scanned across the surface of the sample in question. At each probe position on the surface, signals are measured by a number of different types of detector. Commonly, scattered electrons and x-rays are detected and for each signal, magnified images of the specimen are constructed where the signal strength modulates the intensity at positions corresponding to the probe positions scanned on the surface. At each probe position, the energy spectrum of the scattered electrons and x-rays is determined by the composition and topography of the sample surface and underlying bulk material. At present compositional analysis in an SEM is most commonly achieved with x-ray detection.

When the SEM is operational, electrons comprising the incident probe penetrate the specimen and follow irregular paths due to sideways scattering. X-rays, Auger electrons and secondary electrons are produced throughout the electron trajectory envelope which can extend to some microns below the surface. The effective probe diameter therefore broadens with depth and the information volume is large. This can make the identification of thin layers and features below 1000 nm in dimension difficult. Low energy electrons have a very limited range and only escape from layers very close to the surface where the probe is still narrow. In the majority of SEMs, low energy secondary electrons are detected to form a high resolution "secondary" electron image of the sample which shows topographic contrast but gives little information about the composition of the specimen. In principle, high resolution images can also be obtained using the signal from low-energy Auger electrons and, if the detector is energy-selective, characteristic Auger emissions can be used to identify some elements present in the specimen. While Auger spectrometry is commonly available on Ultra High Vacuum (UHV) "surface analysis" microscopes (typically $10^{-9}$ torr), it is rarely available in conventional SEMs (<$10^{-5}$ torr) partly because of the size and expense of high resolution electron spectrometers.

Backscattered electrons are the higher energy electrons that, after entering via the incident beam, "bounce" back out of the specimen and hit an electron detector. These electrons give atomic number (Z) information and the information volume is less than for x-rays but the region generating the signal is generally still substantially wider than the incident probe diameter. If the incident beam voltage is reduced, the sideways scattering is less but the total backscattered signal is not always proportional to Z at low incident beam voltages.

Electrons that are backscattered out of the specimen in the early stage of the electron trajectory near the surface will have energies close to the primary beam energy and are thus "low loss electrons" (LLEs). These LLEs produce a signal that arises from a shallow region that is close to the incident beam. One way to observe this signal is to tilt the sample and observe glancing reflections because this increases the proportion of LLEs that reach a conventional backscattered electron detector (see William E. Vanderlinde, "Forward Scattered Scanning Electron Microscopy for Semiconductor Metrology and Failure Analysis", Proceedings from the 29th International Symposium for Testing and Failure Analysis, Nov. 2-6, 2003, Santa Clara, Calif. USA). However, it is not always possible to tilt the sample sufficiently and spatial resolution and depth of field is compromised in this configuration. Alternative approaches use energy filtering to detect only LLEs. With energy filtering, the sample can be flat and spatial resolution is improved compared with the tilted sample method. In addition, the signal depends on Z even down to low beam voltages (Applied Surface Science, Vol. 120, pg 129-138, 1997 I. R. Barkshire, R. H. Roberts and M. Prutton).

One method of detecting the LLEs is to use a spherical grid retarding analyser as described in U.S. Pat. No. 5,408,098. Spherical grid retarding analysers occupy a large volume around the sample, require a fixed sample/analyser position and the presence of even small stray magnetic fields degrades the energy resolution considerably.

Published US patent application US20040245465 (and extensions described in http://www.smt.zeiss.com/C1256E4600307C70/EmbedTitelIntern/new_detection_system_for_leo_fe-sem/$File/new_detection_system_for_ 1 eo_fe-sem.pdf), shows an in-lens detector where backscattered electrons travelling back up the axis of the electron lens have to have enough energy to pass a retarding grid filter before being detected. This makes good use of the existing electron optics but the energy cut off is not sharp and energy resolution is typically limited to approximately 120 eV which limits the spatial resolution. Furthermore, in this configuration low loss electrons can only be selectively filtered for operating voltages up to 3 kV.

Rather than select all electrons up to a given loss energy, a narrow energy band can be selected using a conventional dispersion type electron energy analyser as used on surface analysis instruments.

For a concentric hemispherical analyser, a rather small solid angle of emitted electrons is accepted so the efficiency of collection is small. A transfer lens is generally used to convey electrons from the sample to the entrance slit between the hemisphere. The lens is usually electrostatic, and in some cases includes a curved mesh or grid lens to improve collection efficiency (as described in U.S. Pat. No. 4,358,680).

The cylindrical mirror analyser is an alternative although it occupies a lot of volume around the specimen region and is conventionally used in dedicated UHV surface analysis instruments where the electron gun and detector can be integrated. Here Auger electrons are directed back beyond and around the outside of the electron gun for subsequent detection. The large size can make it impractical for use in a conventional SEM fitted with multiple detectors for different types of signal.

The electron detectors described so far will record all scattered electrons in a prescribed energy range and an image is formed pixel-by-pixel by scanning an electron probe over the specimen surface. If the specimen is crystalline, then the scattered electrons will exhibit diffraction effects and diffraction patterns can be visualised at a single probe position by imaging the angular distribution of scattered electrons.

U.S. Pat. No. 6,492,644 describes a device for energy and angle-resolved spectroscopy that is suitable for imaging the angular distribution of scattered electrons in an SEM. This device uses a decelerating lens to take electrons emerging at a range of angles from the probe on the sample and form them into essentially parallel trajectories whose reciprocal distances correspond to the original angular distribution. Therefore, a flat imaging detector can be used to record a diffraction pattern and a single flat electrostatic mesh can be biased to reflect lower energy electrons so that the diffraction image is formed from higher energy electrons only. This device provides a sharp energy cut-off but the requirement to preserve the relative angular relationships of electron trajectories for diffraction analysis places restrictions on the range of source positions that can be studied. It also requires a large diameter tube to match the size of the camera and means performance is seriously degraded when there is a stray magnetic field in the vicinity of the specimen.

One object of the invention is to provide a compact analyser device that can be fitted to a wide range of conventional apparatus such as scanning electron microscopes, for detecting a large solid angular range for particles scattered out of a specimen. It is a further object that the device will analyse the energy spectrum of emitted particles with good energy resolution and can also operate when there is a magnetic field in the vicinity of the specimen. Since we are not concerned with imaging the angular distribution of scattered particles and can relax the constraints associated with this requirement it is a further object to thereby make use of non-imaging lenses and also smaller, more efficient non-imaging charged particle detectors, particularly electron detectors.

SUMMARY OF THE INVENTION

In accordance with a first aspect of the present invention we provide a charged particle analyser comprising:
- a first electrostatic non-imaging lens for receiving charged particles having divergent trajectories and for converting the said trajectories into substantially parallel trajectories;
- at least one planar filter for receiving the charged particles having the said substantially parallel trajectories and for filtering the charged particles in accordance with their respective energies;
- a second electrostatic non-imaging lens for receiving the energy filtered charged particles and selectively modifying their trajectories as a function of their energies; and
- a charged particle detector for receiving the charged particles in accordance with their selectively modified trajectories.

The charged particle analyser according to the first aspect therefore provides a number of advantages over known analysers. The combination of the first electrostatic lens and planar filter ensures that a sharp energy cut-off can be applied at the planar filter by virtue of the substantially parallel trajectories of the collected particles. Beyond the filter a second electrostatic lens allows for the selected collection of the particles passing through the filter such that the second electrostatic lens cooperates with the charged particle detector to act effectively as a second filter. The resultant analyser is therefore compact and versatile with a large collection solid angle. Since the analyser is not concerned with imaging, the respective spatial charged particle trajectories need not be maintained in relation to one another thereby allowing a significant reduction in the size of the analyser.

The first electrostatic lens defines a wide angle collection aperture which collects charged particles diverging from a small region of a sample. The first electrostatic lens is designed so as to provide substantially parallel charged particles at the planar filter for a range of incident particle energies. The planar filter itself typically comprises one or more electrostatic filter grids. Each grid typically defines a plane and takes the form of a fine "high transparency" mesh through which the charged particles are selectively passed according to their energies, the particles approaching the filter grids in a direction normal to the grid planes. To further improve the uniformity of the electrostatic barrier and hence the energy resolution of the analyser the filter grids may be held at equal electrical potentials to one another. The filter is therefore adapted to prevent the passage of charged particles having energies below a predetermined threshold, this threshold being achieved by providing the filter at an electrostatic potential which is of equal polarity to the incoming charged particles.

The first electrostatic lens typically comprises a converging lens which converts the divergent trajectories of the charged particles into the parallel trajectories. This may be achieved in a number of ways although preferably the first electrostatic lens consists of at least two axially symmetric elements held at differing electric potentials. The final element before the filter grids may be a tubular electrode terminated with a high transparency fine mesh, whose influence on the electric field in front of the filter grids assists in making the charged particle trajectories parallel as they approach the filter grids. The first electrostatic lens may further comprise additional elements which may take number of different forms, including a spherical grid or a planar grid, or a further tubular electrode. The first element of the electrostatic lens may be held at the same potential as the sample to shield the sample from the electric field of the electrostatic lens.

When the final element before the filter grids is held at a potential with the same polarity to that of the charged particles being detected, the first electrostatic lens may be described as a decelerating lens and assists in giving good energy resolution. When the final element before the filter grids is held at a potential with the opposite polarity to that of the charged particles, the first electrostatic lens may be described as an accelerating lens. This provides advantages for the detection of charged particles in magnetic fields although there is some loss in energy resolution. The elements of the first electrostatic lens may be provided with controllers so as to selectively control the electric potentials during use. The electrical potentials of the first electrostatic lens may therefore be modified during the operation of the analyser.

As an alternative to a lens with axially symmetric elements, a lens with non-axially symmetric elements such as a quadrupole lens may be used.

The second electrostatic lens typically comprises an aperture through which the charged particles are selectively directed. The second electrostatic lens may be operated so as to be electrically grounded to maximise the collection of electrons passing through the filter. It may also be provided with a common electrical potential to that of the planar filter in which case the aperture selectively blocks higher energy charged particles. As a further alternative the second electrostatic lens may be provided with an electrical potential which is modified during the operation of the analyser by a suitable controller.

Each of the electrically charged components of the analyser, such as the lenses and filters, may be controlled by individual controllers. However, a common controller may also be used for one or more of the lenses or filters. Each controller may be computer controlled, for example using a system computer which oversees the operation of additional apparatus such as a scanning electron microscope.

The charged particle detector which detects the charged particles passing through the second electrostatic lens, may take a number of forms including a channeltron, a microchannel plate, a scintillator optically coupled to a photomultiplier, a solid state detector, a gas based detector such as a proportional counter or Geiger counter, or even an electrode connected to an ammeter.

The apparatus of the analyser is typically provided in an arrangement such that each of the lenses and filters are provided on a common axis wherein the analyser has a rotational symmetry about a central common axis passing through at least the first electrostatic lens, filter and second electrostatic lens. Whilst this linear arrangement of the apparatus provides for a compact form for fitment to or inside of the apparatus such as a microscope, it also means that there may be line-of-sight between the charged particle detector and the sample. In order to prevent electromagnetic radiation reaching the detector directly from the sample, the apparatus may typically further comprise a stop positioned between the sample from which the particle trajectories diverge and the charged particle detector itself.

Whilst some of the apparatus has been described as "lenses", this terminology has been used within the present specification in the sense of one or more electrically charged components which deflect the path of charged particles. Unless otherwise indicated, this term is not intended to imply an image-preserving effect, where an image is formed by the combined trajectories of the charged particles. The lenses therefore can be described by the generally accepted term "non-imaging lenses".

Whilst the invention has been described above broadly in terms of charged particles, typically such particles will take the form of electrons. The invention may also be applied to the detection of other non-electron charged particles, in particular positively charged ions including protons, helium ions and, for example, Gallium ions in an ion-beam microscope/milling apparatus.

In the case of electrons, the electrical potentials applied to the components may be used to filter particular electron energies and provide such electrons to the detector, these including Auger electrons and LLEs as described earlier. As will be appreciated, low loss particles in general have an energy which is a significant fraction of the energy of the incident beam which causes the stimulation of the particles from the sample. The analyser may therefore be controlled so as to select the energies of the particles to be detected.

The analyser apparatus itself may form part of a larger analysis apparatus or instrument and therefore in accordance to the second aspect of the present invention we provide a microscope comprising a chamber in which a sample for analysis is placed when in use, a charged particle beam generator for causing a charged particle beam to be incident upon a region of the sample, and a charged particle analyser according to the first aspect of the invention, arranged to receive charged particles emitted from the region in response to the incident beam. Typically the charged particles emitted from the sample are emitted in a reflection or emission mode, rather than a transmission mode. Thus the analyser is typically placed upon the same side of the sample, when in use, as the incident beam. The analyser may also be provided with a movement device so as to allow it to be moveable with respect to the region of the sample from which the particles are received. When the charged particle detector is provided with a central axis, this may be arranged in use to intersect with the region of the sample with which the beam intersects. Alternatively, the axis of intersection may be offset with respect to the region of the sample by an amount to compensate for a magnetic field which is existent between the region of the sample and the analyser. As will be appreciated, in many instances, the microscope will be a scanning electron microscope.

The analyser described above is extremely versatile in its potential uses and, in accordance with a third aspect of the present invention we provide a method of operating the charged particle analyser according to the first aspect of the invention, the method comprising:—
  i) causing a charged particle beam to be incident upon the region of a sample to be analysed;
  ii) positioning the charged particle analyser so as to receive charged particles emitted from the region; and
  iii) operating the analyser such that at least some of the charged particles pass through the first electrostatic lens, the planar filter and the second electrostatic lens so as to be detected at the detector.

The charged particle analyser may be operated in a high pass mode such that substantially all of the particles passing through the filter and having an energy in excess of a predetermined threshold are received at the detector. Alternatively, the charged particle analyser may be operated in a pass band mode such that only charged particles lying in an energy range between upper and lower energy thresholds are received at the detector. The pass band mode therefore lends itself to spectrum analysis by operating the charged particle analyser such that the lower and upper energy thresholds are modified so as to detect the particles received at the detector from a sample at a plurality of different pass band energies. The detector output can therefore be recorded in accordance with each pass band and a spectrum thereby generated.

The invention thus provides a compact charged particle, analyser that has a high acceptance angle and is capable of selecting low loss particles or measuring the particle energy spectrum. The analyser can be arranged to be easily retracted when not in use and is therefore compatible with conventional SEMs where there are often several types of detector mounted around the specimen chamber. Further advantages are that the sensitive point on the sample can be adjusted electronically and the analyser can operate in SEMs with or without magnetic immersion fields. The energy filter can operate in a high pass or a band pass mode and can be ramped to obtain information on intensity vs energy.

Some examples of charged particle analysers and methods according to the invention will now be described with reference to the accompanying drawings, in which:—

Figure 2:
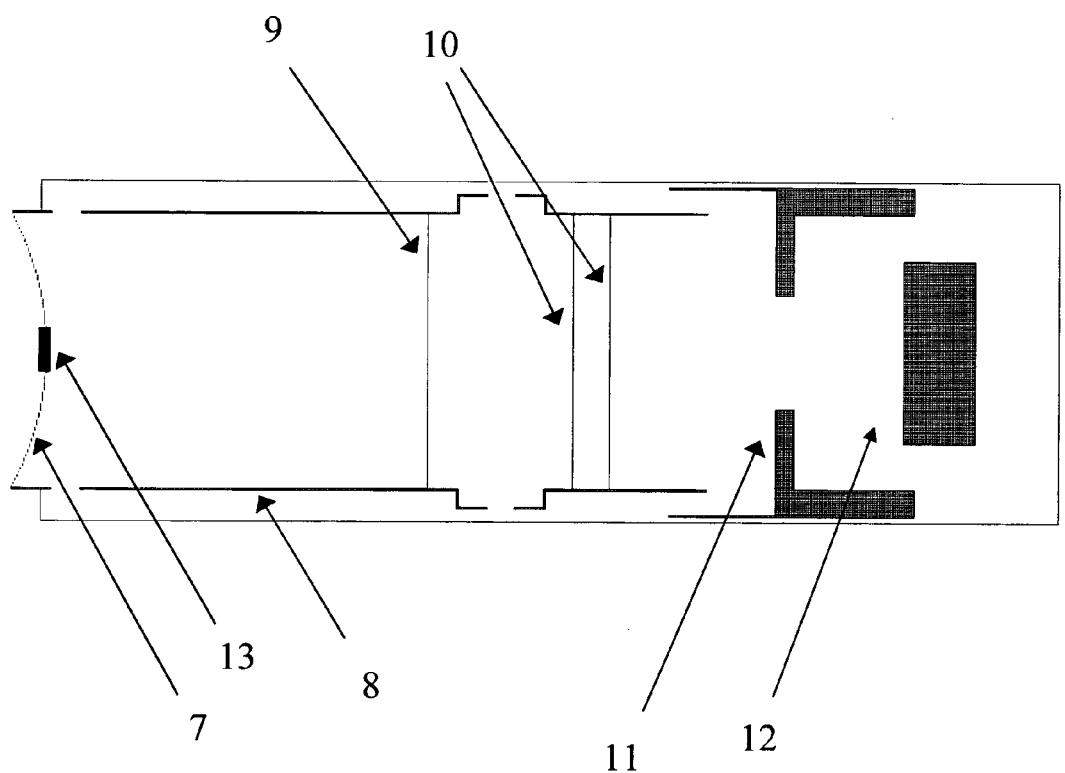
Figure 3A:
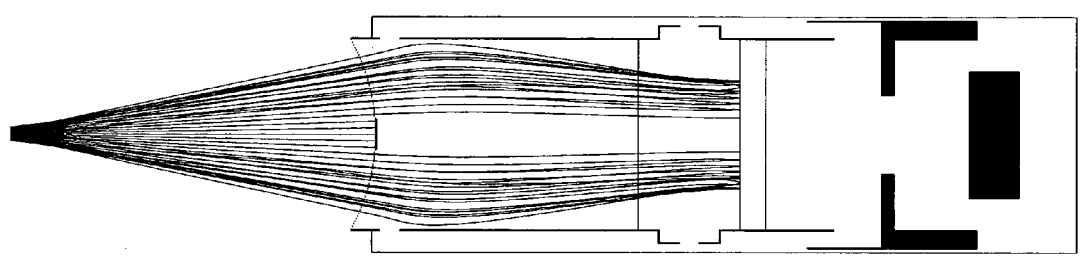
Figure 3B:
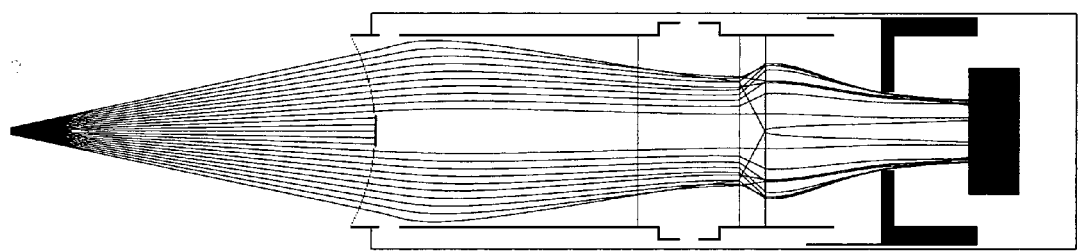
Figure 5A:
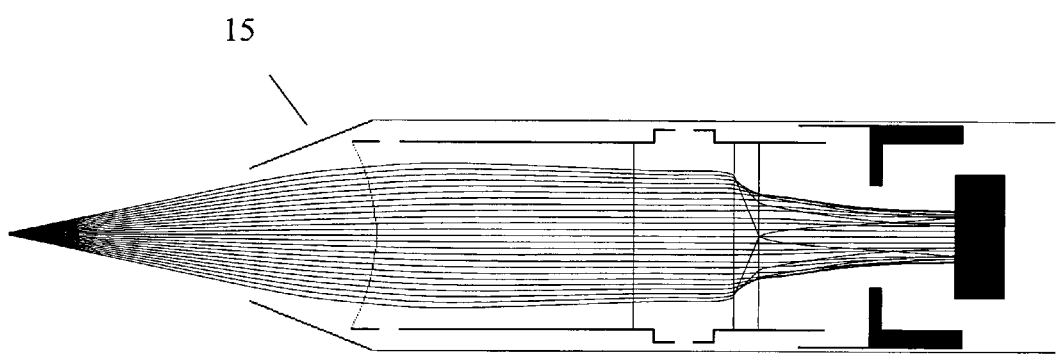
Figure 5B:
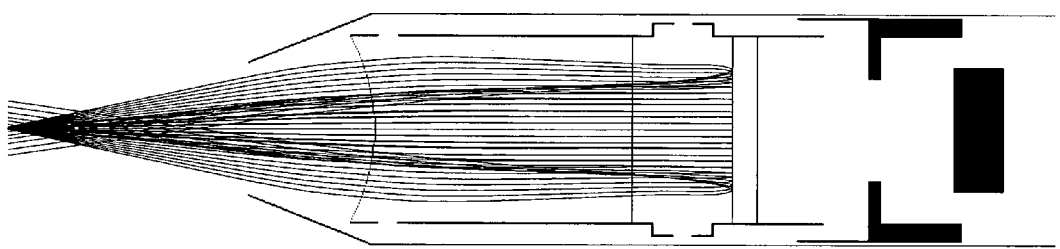
Figure 6A:
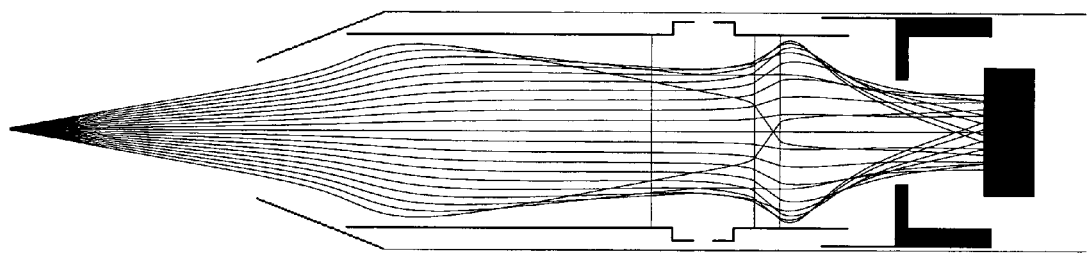
Figure 6B:
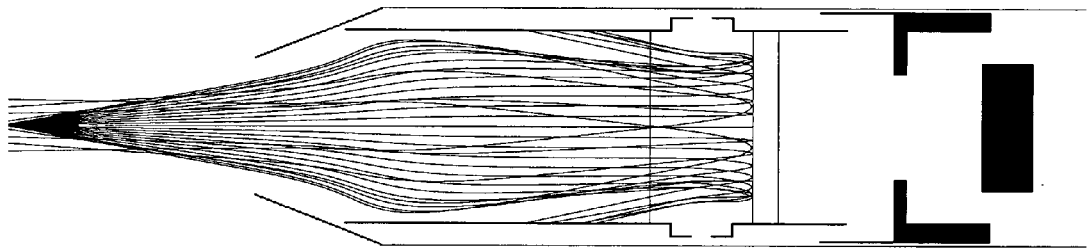
Figure 7A:
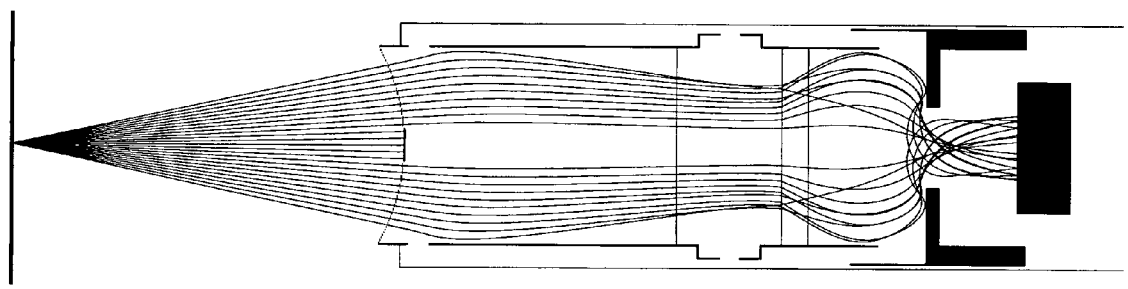
Figure 7B:
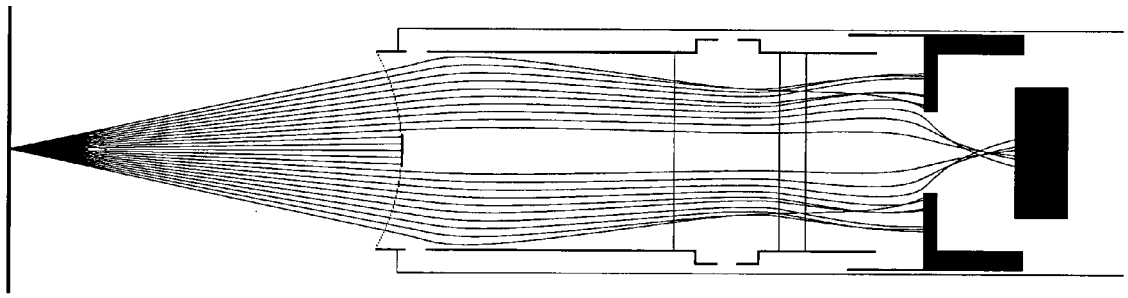
Figure 8A:
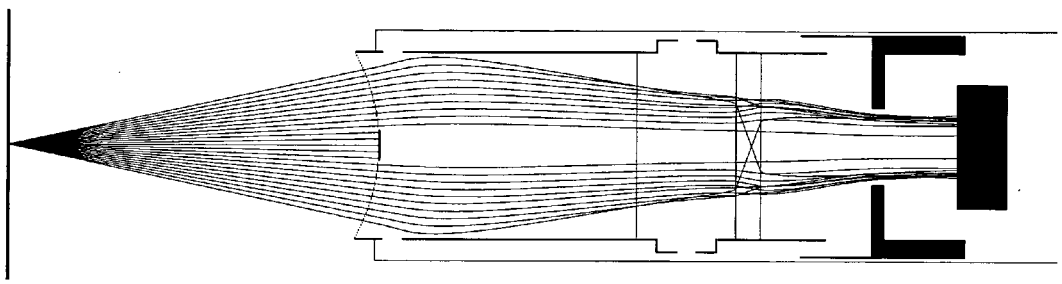
Figure 8B:
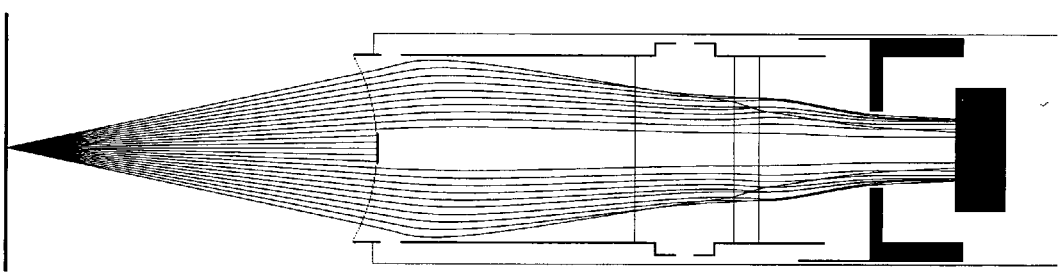
Figure 9A:
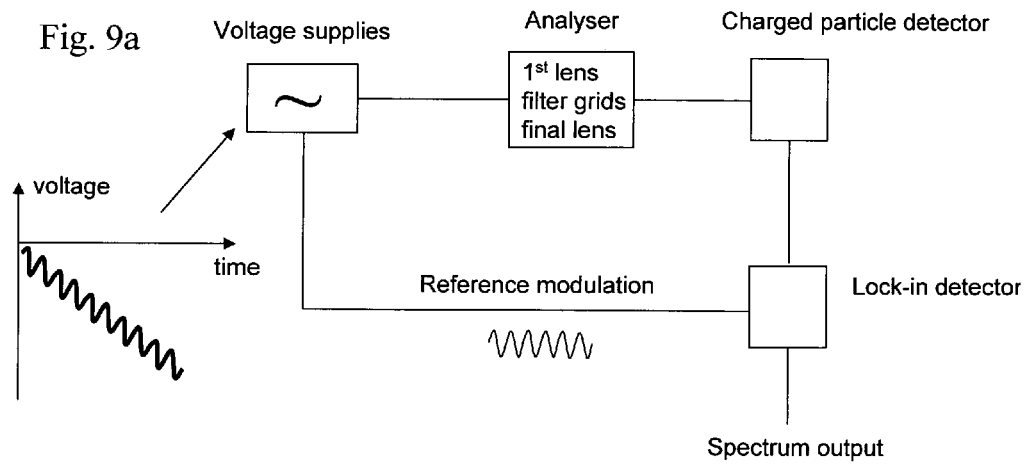
Figure 9B:
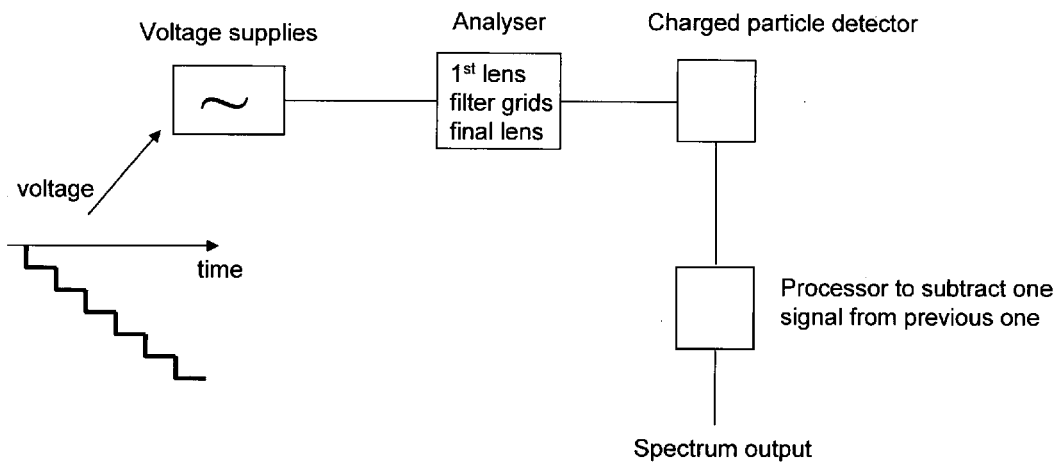

FIG. 1 describes the general arrangement of an example charged particle analyser in a microscope;

FIG. 2 shows a schematic view, partly in section, of a first example analyser;

FIGS. 3*a* and 3*b* show the effect of the filter for relatively low (3*a*) and high (3*b*) energy particles;

FIG. 4 shows the axial offset of the analyser to account for magnetic fields;

FIGS. 5*a* and 5*b* shows a second example analyser including an accelerating entry lens;

FIGS. 6*a* and 6*b* shows a third example having a "gridless" entry lens for particle energies above (6*a*) and below (6*b*) a lower energy threshold;

FIGS. 7*a* and 7*b* shows a band pass mode where all particles fall within the band (7*a*) and where some high energy particles fall outside the band (7*b*);

FIGS. 8*a* and 8*b* show a high pass mode of operation for particle energies just in excess of a threshold (8*a*) and substantially in excess of a threshold (8*b*); and, FIGS. 9*a* and 9*b* show example methods for obtaining a charged particle spectrum by a voltage modulation (9*a*) and a band scanning (9*b*) technique.

DESCRIPTION OF EXAMPLES

Referring to FIG. 1, the invention as embodied in this first example is a detection device (charged particle analyser) that has an entrance aperture that, when in use, is presented towards a sample 2 in a scanning electron microscope 100 from the same side as the incident electron beam 3. The incident beam consists of electrons that have been accelerated using a high voltage $V_{acc}$ (typically 1 kV to 30 kV) and focused through a microscope lens 4. The electrons all strike the specimen with essentially the same energy. The specimen is typically earthed and incident electrons penetrate the sample 2 and are scattered.

The detection device 1 uses a converging electrostatic lens to accept diverging electron trajectories 6 from a wide solid angle and redirect them down a tube towards a planar retarding grid such that they all strike the grid at approximately the same angle. With this arrangement the energy threshold at which electrons can get through the grid is similar for all trajectories so there is a sharp energy cut-off.

Beyond the retarding grid a further focussing lens concentrates the trajectories so that a small detector can be used to detect those electrons that are just energetic enough to pass through the grid. Small detectors tend to be more efficient and give faster signal response time. By using an aperture over the detector as part of the second electrostatic lens, those electrons that have much higher energy will strike the aperture rather than be focussed through the aperture and will not contribute to the detected signal.

Thus the planar retarding grid provides a high resolution "high pass" energy filter and the addition of a post-grid lens and aperture provides a lower resolution "low pass" filter to selectively detect a band of energies for electrons emitted towards the device.

The sharp cut-off high pass mode is useful for imaging LLEs with energies very close to the incident beam energy. The difference between signals recorded at two different cut-off energies provides the signal for the band of energies between these limits. Thus, by a series of measurements at different cut-off energies, it is possible to construct the energy spectrum for electrons emitted from the sample.

One problem with subtracting signals is that the noise in each signal is added in quadrature so the relative noise on the difference result can be prohibitive if the signals being subtracted are large compared with the result. If the combination of high pass and low pass filters is used, a band with a sharp low energy cut-off and broad high energy cut-off can be measured. If two measurements are made at different cut-off energies, the result for a narrow energy band can be calculated and the relative noise is reduced because each signal is not made large by superfluous contributions from high energy electrons. Thus, the device can be used to measure features in the electron energy spectrum at much lower energies than that of the incident electron beam, for example Auger emission lines.

Some examples of the invention are now described in further detail.

In a first example, the electron analyser 1 consists of a first electrostatic lens to collect the desired electrons, and transport them to a set of planar grids (planar filter) with appropriately applied potentials to filter out the undesired electrons with energies below a minimum desired energy. A post filter electrode (second electrostatic lens) is used to focus the desired electrons having traversed the filter grids. A detector is used to translate the number of desired electrons into a useful signal.

FIG. 2 shows the components that can be used to implement such a device according to the first example. A wire grid 7 (penultimate element) is positioned at the entrance and is preferably curved and typically biased at zero volts. A tubular electrode 8 forms part of the first electrostatic lens (last element) and is typically biased to a negative potential which is a large fraction of the potential used to accelerate the electrons that form the incident beam on the specimen. Together with the transparent grid 9, the tubular electrode 8 acts as a lens to redirect diverging electrons from the specimen so that they all travel towards the energy selecting grids 10 forming the planar filter. Notably, since in practice the distance between the sample and the charged particle analyser is small the angular acceptance is large and the trajectories will cross over and therefore any potential imaging properties are lost. The analyser may be placed as close to the sample as the geometry of the microscope, sample and other detectors will allow, and could be in the range 15 mm to 40 mm. The grids 10 are biased to a large negative voltage to repel any electrons with lower energy in eV than the magnitude of the grid voltage. The higher energy electrons continue through the grid and are accelerated towards a typically earthed aperture 11 forming the second electrostatic lens, and an electron detector 12 beyond.

Typical trajectories have been modelled for a tubular electrode at −5.97 kV with the retarding grid 10 set to −10 kV and shown in FIGS. 3*a* and 3*b*. The top diagram (FIG. 3*a*) shows 9.999 keV electrons emanating from the specimen and these are reflected by the retarding grid 10. The lower diagram (FIG. 3*b*) shows 10.005 keV electrons that are energetic enough to reach the electron detector.

As shown in FIGS. 3*a* and 3*b*, the trajectories do not have to maintain reciprocal distances that correspond to the original angular distribution and indeed, some trajectories may cross over. However, the lens 8,9 does ensure that the trajectories are all essentially in the same direction when the electrons reach the planar grid 10 and this ensures a sharp cut-off energy.

The analyser 1 may be fitted with means (not shown) to retract or advance the analyser relative to the sample.

Near the entrance to the analyser may be suspended (for example by means of fine wires or as part of a mesh lens), a small disk, or stop 13, in the line-of-sight from the sample to the detector 12. X-rays emitted from the specimen also travel towards the device but will not be affected by the electrostatic field that concentrates electrons. Therefore, the small x-ray stop 13 can be used to block the direct line-of-sight to the electron detector to reduce background noise from x-rays and assist in aligning the analyser with the point of impact of the incident electron beam.

Figure 4A:
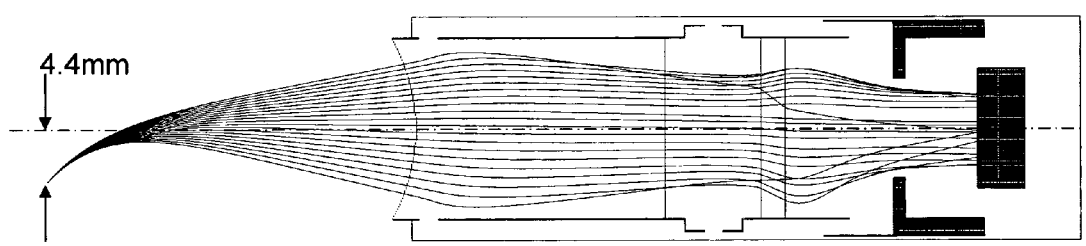
Figure 4B:
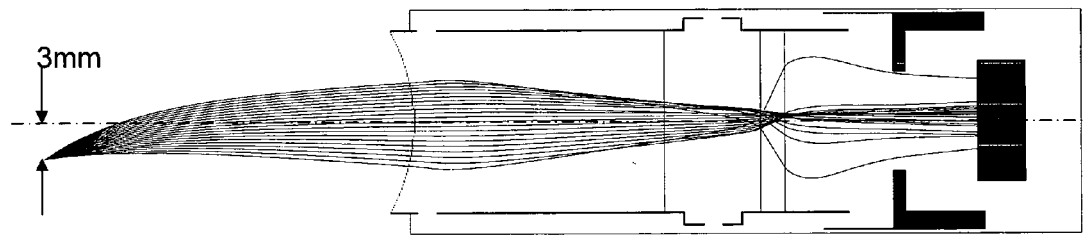
Figure 4C:
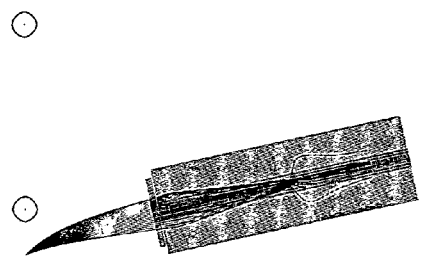

In the absence of a substantial magnetic field around the sample (for example in a non-immersion lens type SEM) the central (preferred) axis of the analyser intersects the sample at the same point as the primary beam. When there is a magnetic field in the vicinity of the sample 2 in approximately the same direction as the electron beam, then the analyser can still be used for energy filtering by offsetting the entrance aperture by an extent dependent on the strength of the magnetic field. The device can be made less sensitive to the effect of magnetic field by concentrating electrons with an accelerating lens at some expense to the energy resolution of the high pass energy filter. In the presence of a magnetic field (such as is created by an immersion lens SEM) the preferred axis of the analyser is therefore slightly offset as shown in FIGS. 4*a* and 4*b*. FIG. 4*c* schematically illustrates the presence of a magnetic dipole influencing the particle trajectories. The distances in FIGS. 4*a* and 4*b* show the analyser offset relative to the sample origin. The analyser may be fitted with means to effect this offset from outside the SEM chamber including for example a motor drive and control system.

The penultimate element may comprise a planar wire grid 7 at the same potential as the sample, with the tubular electrode behind the grid at a more negative and variable potential. In this way the electric field around the sample is not disturbed by the analyser. In this case the electrons are decelerated whilst travelling through the lens. Alternatively, in a second example analyser, an additional electrode (shield element) at the same potential as the sample may be placed in front of the grid 7. The grid 7 is then biased to a variable positive potential, thus creating an accelerating lens as shown in FIGS. 5*a* and 5*b*. An accelerating lens will result in poorer energy resolution than a decelerating lens, but make the device less susceptible to stray electrostatic and magnetic fields. FIG. 5*a* shows the paths of electrons having sufficient energies to pass through the grids 10 following acceleration by grid 7. FIG. 5*b* shows electrons having insufficient energies.

In a third example the grid 7 is replaced with an electrode consisting of an aperture or a tubular section as shown in FIGS. 6*a* and 6*b* (showing relatively high and relatively low energy electrons with respect to the grid 10 potential respectively). Other versions of electrostatic lenses may be used, for example quadrupole lenses.

Depending on the geometry and size of the sample and other components of the SEM 100, and the presence of other detectors, the optimum distance between the analyser and the sample may vary. The closer the analyser is to the sample the greater the strength of the electrostatic lens needed to collect the desired electrons. This can be achieved by varying the potentials on the electrodes comprising the first electrostatic lens.

Following passage through the entry and first electrostatic lenses, the electrons next enter the region of the planar filter grids 10. Being some distance from the sample this region can be magnetically shielded to improve the energy resolution of the analyser. A plurality of grids further improves the energy resolution of the analyser. Potentials can be applied individually or in groups to the grids to retard electrons having energy less than that of the desired electrons. Being planar, the grids can be of finer construction and greater mechanical precision than curved grids, resulting in better energy resolution and higher transmission.

The electrons with sufficient energy to traverse the filter grids 10 will be affected differently by subsequent electric fields depending on their energy. In one example a disk with an aperture may be positioned in front of the electron detector and can be electrically connected to the ground potential so as to form part of the second electrostatic lens, or, by means of an external switch, to the same potential as the retarding grids. When it is connected to ground (high-pass mode), the electric field so created attracts onto the detector even electrons with substantial energy (FIG. 8*b*) as well as those with energy just sufficient to traverse the filter grids 10 as shown in FIG. 8*a*. When it is switched to the same potential as the retarding filter grids, predominantly those electrons with energy just sufficient to traverse the filter grids are attracted onto the detector (FIG. 7*a*) whilst those with greater energy are not deflected sufficiently to pass through the aperture (FIG. 7*b*).

Alternatively a variable potential on the aperture, or on further electrodes between the retarding grids and the detector, may be applied to better control the band-pass nature of the device. A control system 20 (see FIG. 1) can be used to effect this, as well as the control of the other lenses and filters. Such a control system is preferably under the control of an analysis computer which also operates the microscope.

The detector 12 may be any of the devices commonly used to detect electrons of moderate energy. These include but are not limited to a single or multichannel electron multiplier such as a channeltron or microchannel plate, or a scintillator optically coupled to a photomultiplier tube, or an electrode connected to an ammeter.

It is also envisioned that the analyser may also be used as a combined loss/Auger analyser by adjusting the lens/filter voltages on a single analyser to allow operation as either an LLD detector or an Auger electron spectrometer.

Two methods of using the charged particle analysers of the invention to perform particle energy spectrometry are now described.

In the first example shown in FIG. 9*a* the "pass" energy of the planar filter is set to a desired particle energy for recording in the spectrum and the second electrostatic lens is set to exclude particle energies in excess of this pass energy to improve the signal-to-noise ratio for Auger spectroscopy, or can be set to accept all energies above the filter energy for low loss detection. The controller is then used to modulate the pass energy of the planar filter and second electrostatic lens using an oscillating voltage which is scanned systematically over the energy range of interest. The signal proportional to the derivative of the spectrum is measured with a phase-locked loop. The controller provides the oscillating voltage and lock-in functions so as to generate the spectrum.

In the second example shown in FIG. 9*b*, the "pass" band level of the planar filter is set to the upper limit of an energy range of interest. The second electrostatic lens is set to accept or exclude energies above the pass energy, as above. The planar filter energy pass level is systematically altered in a step-wise manner and measurements are taken by the detector at each step. The signal received is effectively the number of charged particles detected in a certain time period. By subtracting the first signal from the second, and so on for each step, the signal due to the particle energies for each step is obtained. This method does not require the oscillating voltage or lock-in electronics of the example above, although suitable signal processing is needed to subtract the signals.

In both methods, when the second electrostatic lens is set to band-pass mode the second lens voltages are typically reduced in tandem with the cut off voltage applied to the filter. The difference between successive signals is then the positive spectral contribution from the desired band and a negative aggregate spectral contribution over the larger cut-off energy band defined by the second lens. These can be deconvolved by mathematical methods to obtain the true spectrum if necessary.

The examples described above primarily relate to the use of the invention with respect to scanning electron microscopes. The principles of the invention may however be used in association with other instruments. For example there exists a specialised instrument which scans a beam of helium ions across the surface of a sample and it will be appreciated that the invention can therefore be used in the detection of positively charged helium ions which are backscattered from such a sample surface. It will further be appreciated that the invention may be used in association with a conventional focussed ion beam instrument where there is a desire to monitor the energy distribution of backscattered charged ions. The invention is therefore generally applicable to instruments in which charge particles are caused to emanate from a sample surface as a result of an incident particle beam.

The invention claimed is:

1. A charged particle analyser comprising:
    a first non-imaging electrostatic lens for receiving charged particles having divergent trajectories and for converting the said trajectories into substantially parallel trajectories;
    at least one planar filter, comprising one or more planar electrostatic filter grids, for receiving the charged particles having the said substantially parallel trajectories and for filtering the charged particles in accordance with their respective energies, wherein the filter is adapted to provide a decelerating field to prevent passage of charged particles having energies below a predetermined threshold;
    a second non-imaging electrostatic lens for receiving the energy filtered charged particles and selectively modifying their trajectories as a function of their energies; and
    a charged particle detector for receiving the charged particles in accordance with their selectively modified trajectories;
    wherein the charged particle analyser is positioned on a beam side of a specimen for the receipt of electrons scattered from the specimen as a result of interaction between the specimen and the electron beam.

2. A charged particle analyser according to claim 1, wherein the first electrostatic lens is operative to provide substantially parallel charged particles for a range of incident particle energies.

3. A charged particle analyser according to claim 1, wherein two electrostatic filter grids are provided in parallel planes and held at similar electrical potentials.

4. A charged particle analyser according to claim 1, wherein the first electrostatic lens comprises a converging lens.

5. A charged particle analyser according to claim 1, wherein the first electrostatic lens comprises a quadrupole lens.

6. A charged particle analyser according to claim 1, wherein the first electrostatic lens comprises at least two axially symmetrical elements.

7. A charged particle analyser according to claim 6, wherein the symmetrical elements comprise a first element and a final element, the first element being encountered by the charged particles before the final element.

8. A charged particle analyser according to claim 7, wherein the final element is a tubular electrode through which the charged particles pass when in use.

9. A charged particle analyser according to claim 8, wherein the tubular electrode is terminated with a fine mesh.

10. A charged particle analyser according to claim 7, wherein in use the final element is provided with the same polarity as the charged particles so as to act as a decelerating lens.

11. A charged particle analyser according to claim 7, wherein in use the final element is provided with the opposite polarity to the charged particles so as to act as an accelerating lens.

12. A charged particle analyser according to claim 6, further comprising one or more additional elements positioned between the first and final elements.

13. A charged particle analyser according to claim 6, wherein one or each of the first or additional elements is selected from the group of a spherical grid, a planar grid and a tubular electrode.

14. A charged particle analyser according to claim 6, wherein in use the first element is held at the same electrical potential as the specimen.

15. A charged particle analyser according to claim 1, wherein the second electrostatic lens further comprises an aperture.

16. A charged particle analyser according to claim 15, wherein the second electrostatic lens is electrically grounded.

17. A charged particle analyser according to claim 15, wherein the second electrostatic lens is provided with a common electrical potential to that of the planar filter.

18. A charged particle analyser according to claim 1, further comprising a controller for selectively controlling one or more of:
    a) the strength of the first electrostatic lens;
    b) the energy filtering profile of the filter;
    c) the strength of the second electrostatic lens; and
    d) the energy sensitivity of the charged particle detector.

19. A charged particle analyser according to claim 1, wherein the detector is a non-imaging charged particle detector device.

20. A charged particle analyser according to claim 1, wherein the detector is selected from the group consisting of a channeltron, a microchannel plate, a scintillator optically coupled to a photomultiplier, a solid state detector, a proportional counter, a Geiger counter, and an electrode connected to an ammeter.

21. A charged particle analyser according to claim 1, wherein the analyser has rotational symmetry about a central axis passing through at least the first electrostatic lens, filter and second electrostatic lens.

22. A charged particle analyser according to claim 1, further comprising a disk of material to act as a stop located between a sample from which the received particle trajectories diverge, and the charged particle detector, the stop being positioned to prevent electromagnetic radiation from the region reaching the detector.

23. A charged particle analyser according to claim 1, wherein the analyser is selected from the group consisting of an electron analyser, a positive ion analyser, a helium ion analyser, and a gallium ion analyser.

24. A charged particle analyser according to claim 1, wherein the first and second electrostatic lenses, and the planar filter, are arranged to cause low loss particles to be incident upon the detector, the energies of the low loss particles being in a range between a predetermined energy and the beam energy of a charged particle microscope.

25. A charged particle analyser according to claim 1, adapted to allow the analysis of a spectrum of charged particle energies by the modification of one or more of the electrical potentials of the first electrostatic lens, the second electrostatic lens and planar filter so as to select the charged particle energies to be detected.

26. A microscope comprising a chamber in which a sample for analysis is placed when in use, a charged particle beam generator for causing a charged particle beam to be incident upon a region of the sample, and a charged particle analyser according to claim 1 arranged to receive charged particles emitted from the region in response to the incident beam.

27. A microscope according to claim 26, further comprising a movement device to which the analyser is attached such that the charged particle analyser is moveable with respect to the region of the sample.

28. A microscope according to claim 26, wherein the charged particle detector has a central axis and wherein the axis intersects the region of the sample.

29. A microscope according to claim 26, wherein the charged particle detector has a central axis and wherein the axis is offset with respect to the region of the sample by an amount to compensate for a magnetic field between the region and the analyser.

30. A microscope according to claim 26, wherein the region of the sample is less then ten percent of the area within which emitted charged particles are received in use by the analyser.

31. A microscope according to claim 26, wherein the microscope is a scanning electron microscope.

32. A method of operating a charged particle analyser comprising:
   a first non-imaging electrostatic lens for receiving charged particles having divergent trajectories and for converting the said trajectories into substantially parallel trajectories;
   at least one planar filter, comprising one or more planar electrostatic filter grids, for receiving the charged particles having the said substantially parallel trajectories and for filtering the charged particles in accordance with their respective energies, wherein the filter is adapted to provide a decelerating field to prevent passage of charged particles having energies below a predetermined threshold;
   a second non-imaging electrostatic lens for receiving the energy filtered charged particles and selectively modifying their trajectories as a function of their energies; and
   a charged particle detector for receiving the charged particles in accordance with their selectively modified trajectories;
   wherein the charged particle analyser is positioned on a beam side of a specimen for the receipt of electrons scattered from the specimen as a result of interaction between the specimen and the electron beam;
   the method comprising:
   i) causing a charged particle beam to be incident upon the region of a sample to be analysed;
   ii) positioning the charged particle analyser so as to receive charged particles emitted from the region; and
   iii) operating the analyser such that at least some of the charged particles pass through the first electrostatic lens, the planar filter and the second electrostatic lens so as to be detected at the detector.

33. A method according to claim 32, wherein the charged particle analyser is operated in a high pass mode such that substantially all of the particles passing through the filter and having an energy in excess of a predetermined threshold are received at the detector.

34. A method according to claim 32, wherein the charged particle analyser is operated in a pass band mode such that predominately charged particles lying in an energy range between predetermined upper and lower energy thresholds are received at the detector.

35. A method according to claim 34, further comprising:
   i) operating the charged particle analyser such that the lower and upper energy thresholds are modified so as to detect the particles received at the detector from the sample at a plurality of different pass band energies; and
   ii) recording the detector output so as to form a charged particle energy spectrum.

36. A method according to claim 34, further comprising:
   i) recording the detector output whilst operating the analyser to provide charged particles to the detector at different respective lower thresholds; and
   ii) comparing the signal produced by the detector at the different energies so as to form a charged particle energy spectrum.

37. A scanning electron microscope configured for performing spectroscopy upon electrons scattered from a specimen, the microscope comprising:
   apparatus for generating an electron beam;
   a lens system for focussing the electron beam on a specimen along a first axis;
   a sample stage for orienting the specimen with respect to the beam;
   a charged particle analyser positioned on a beam side of the specimen for the receipt of electrons scattered from the specimen as a result of interaction between the specimen and the electron beam, wherein the charged particle analyser comprises:
     a first non-imaging electrostatic lens for receiving charged particles having divergent trajectories and for converting the said trajectories into substantially parallel trajectories;
     at least one planar filter, comprising one or more electrostatic filter grids, for receiving the charged particles having the said substantially parallel trajectories and for filtering the charged particles in accordance with their respective energies, wherein the filter is adapted to provide a decelerating field to prevent passage of charged particles having energies below a predetermined threshold;
     a second non-imaging electrostatic lens for receiving the energy filtered charged particles and selectively modifying their trajectories as a function of their energies; and
     a charged particle detector for receiving the charged particles in accordance with their selectively modified trajectories; wherein the first non-imaging electrostatic lens, the at least one planar filter, the second non-imaging electrostatic lens, and the charged particle detector are arranged on a second axis that is spatially separate from the first axis; and
   a computer control system configured to control the first electrostatic lens, the planar filter and the second electrostatic lens so as to perform energy spectroscopy on the scattered electrons from the specimen.

* * * * *